(12) United States Patent
Haddad et al.

(10) Patent No.: US 6,717,233 B1
(45) Date of Patent: Apr. 6, 2004

(54) METHOD FOR FABRICATING RESISTORS WITHIN SEMICONDUCTOR INTEGRATED CIRCUIT DEVICES

(75) Inventors: Nadim Haddad, Oakton, VA (US); Charles N. Alcorn, Centreville, VA (US); Jonathan Maimon, Manassas, VA (US); Leonard R. Rockett, Washington D. C., WA (US); Scott Doyle, Centreville, VA (US)

(73) Assignee: BAE Systems Information and Electronic Systems Integration, Inc., Nashua, NH (US)

( * ) Notice: Subject to any disclaimer, the term of this patent is extended or adjusted under 35 U.S.C. 154(b) by 276 days.

(21) Appl. No.: 09/491,230

(22) Filed: Jan. 25, 2000

Related U.S. Application Data
(60) Provisional application No. 60/118,049, filed on Feb. 1, 1999.

(51) Int. Cl.[7] .................. H01L 29/00; H01L 29/76; H01L 29/94; H01L 31/062; H01L 31/113
(52) U.S. Cl. .................. 257/536; 257/379; 257/380; 257/381; 257/538
(58) Field of Search .................. 257/379, 380, 257/381, 538, 359, 536

(56) References Cited

U.S. PATENT DOCUMENTS

| | | | |
|---|---|---|---|
| 4,146,902 A | * 3/1979 | Tanimoto et al. | ............ 357/6 |
| 5,108,945 A | 4/1992 | Matthews | |
| 5,135,882 A | 8/1992 | Karniewicz | |
| 5,182,225 A | * 1/1993 | Matthews | ............ 437/58 |
| 5,206,533 A | 4/1993 | Houston | |
| 5,275,963 A | 1/1994 | Cederbaum et al. | |
| 5,310,694 A | 5/1994 | Houston | |
| 5,381,046 A | 1/1995 | Cederbaum et al. | |
| 5,438,537 A | 8/1995 | Sasaki | |
| 5,585,302 A | 12/1996 | Li | |
| 5,668,037 A | 9/1997 | Prall et al. | |
| 5,751,050 A | * 5/1998 | Ishikawa et al. | ............ 257/538 |
| 5,838,044 A | * 11/1998 | Chang et al. | ............ 257/369 |

* cited by examiner

*Primary Examiner*—Allan R. Wilson
*Assistant Examiner*—Jesse A Fenty
(74) *Attorney, Agent, or Firm*—Daniel J. Long; Antony P. Ng; Bracewell & Patterson, L.L.P.

(57) ABSTRACT

A method for fabricating resistors within a semiconductor integrated circuit device is disclosed. A resistor is fabricated by first depositing a passivation layer on a semiconductor substrate having multiple transistors previously formed thereon. Next, a first contact window and a second contact window are formed through the first passivation layer at a first contact location and a second contact location, respectively. The first and second contact windows are then filled with metal, such as tungsten, and the metal at the first and second contact windows is planarized to form a first bottom contact and a second bottom contact, respectively. A resistive film, such as polysilicon, subsequently deposited over the first passivation layer. Next, a second passivation layer is formed over the resistive film. Finally, a first top contact and a second top contact are formed to respectively connect the first bottom contact and the second bottom contact to the resistive film.

14 Claims, 3 Drawing Sheets

//METHOD FOR FABRICATING RESISTORS WITHIN SEMICONDUCTOR INTEGRATED CIRCUIT DEVICES

This application claims the benefit of Provisional application Ser. No. 60/118,049, filed Feb. 1, 1999.

The present invention was made under government contract DSWA01-96-C-0106.

BACKGROUND OF THE INVENTION

1. Technical Field

The present invention relates to a method for fabricating integrated circuit devices in general, and in particular to a method for fabricating resistors within integrated circuit devices. Still more particularly, the present invention relates to a method for fabricating polysilicon resistors within semiconductor integrated circuit devices.

2. Description of the Prior Art

Resistors are typically used as load devices within a variety of semiconductor integrated circuit (IC) devices. Although such resistors can be formed by any type of resistive material, it is almost a universal practice in the industry to use a very thin layer of either intrinsic or low-doped polycrystalline silicon. This is because polycrystalline silicon resistors, or commonly known as polysilicon resistors, allow for a significant reduction in the device size, which in turn, results in a high integration density. Furthermore, polysilicon resistors can be stacked above field effect transistors (FETs) to provide an even higher integration density.

Polysilicon resistors are also utilized in static random access memory (SRAM) cells and logic latches to reduce single-event upset (SEU) sensitivities in circuits intended for use in environments, such as space, with a high concentration of charged particles. This is because polysilicon resistors, when employed as decoupling resistors, can slow down the regenerative action of SRAM cells by increasing the RC-time constant, which makes the SRAM cells less likely to be upset when a charged particle impacts a sensitive node of the SRAM cell.

Conventionally, polysilicon resistors are incorporated in the gate polysilicon layer of an IC by using a separate doping implant and blocking the formation of silicide in the resistor region. This technique consumes real estate and is not very compatible with scaled (high-density) IC designs. Hence, it is desirable to provide an improved method for fabricating a more compact polysilicon resistor within a semiconductor IC device.

SUMMARY OF THE INVENTION

In accordance with a preferred embodiment of the present invention, a resistor is fabricated by first depositing a passivation layer on a semiconductor substrate having multiple transistors previously formed thereon. Next, a first contact window and a second contact window are formed through the first passivation layer at a first contact location and a second contact location, respectively. The first and second contact windows are then filled with metal, such as tungsten, and the metal at the first and second contact windows is planarized to form a first bottom contact and a second bottom contact, respectively. A resistive film, such as polysilicon, subsequently deposited over the first passivation layer. Next, a second passivation layer is formed over the resistive film. Finally, a first top contact and a second top contact are formed to respectively connect the first bottom contact and the second bottom contact to the resistive film.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
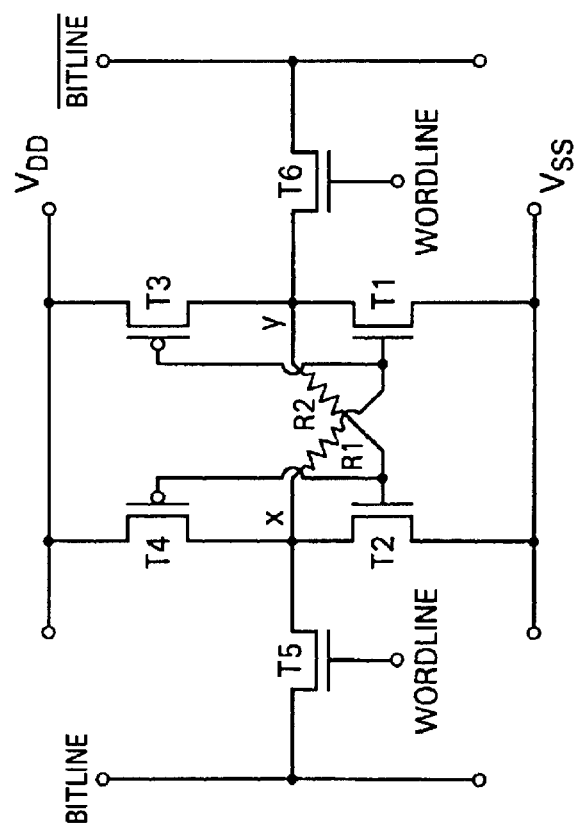
FIG. 1 is a circuit diagram of a static random access memory cell in which a preferred embodiment of the present invention is incorporated.

Referring now to the drawings and in particular to FIG. 1, there is illustrated a circuit diagram of a static random access memory (SRAM) cell in which a resistor in accordance with a preferred embodiment of the present invention is incorporated. The SRAM cell is preferably a single-event upset (SEU) immuned cell. As shown, field effect transistors T1–T4 are coupled between a supply voltage $V_{DD}$ and a ground potential $V_{ss}$, and are cross-coupled to each other. Further, node x is connected to the gate of transistors T1, T3 via resistor R1, and node y is connected to the gate of transistors T2, T4 via resistor R2. In addition, pass transistors T5 and T6 are connected to a wordline and bitlines as is well-known in the art.

Figure 2:
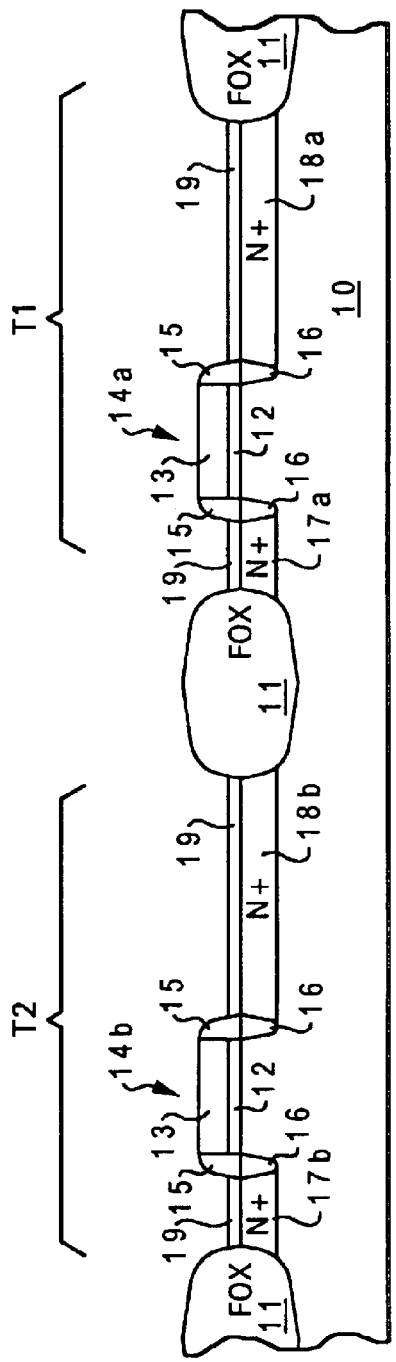
FIG. 2 is a cross-sectional view of a semiconductor implementation of the SRAM cell from FIG. 1, in accordance with a preferred embodiment of the present invention.

The fabrication of the SRAM cell from FIG. 1 begins with a silicon substrate, preferably having a "100" crystallographic orientation. The first series of steps involves the formation of dielectric isolation regions on the silicon substrate for isolating active device regions from each other. With reference now to FIG. 2, a cross-sectional view of a semiconductor implementation of the SRAM cell from FIG. 1 is depicted. In order to simplify the description and the drawings, dielectric isolation regions between active devices, such as dielectric isolation regions 11, are only partially shown and will not be described in detail. In essence, certain selected surface areas of substrate 10 are masked against oxidation, and the unmasked surface areas are then subjected to oxidation such that a thermal oxide can be grown at the unmasked areas. The masked areas remain as a mesa surrounded by the sunken silicon dioxide or field oxide (FOX). Afterwards, active semiconductor devices, such as transistors T1 and T2, can be fabricated in the mesas according to the following processes.

The surface of substrate 10 is thermally oxidized to form a layer of gate oxide 12 with a thickness of approximately 50 Å to 200 Å. Polysilicon layer 13 is blanket deposited by Low Pressure Chemical Vapor Deposition (LPCVD) to a desired thickness. Polysilicon layer 13 is then ion implanted with phosphorous, arsenic, boron ions at a concentration that renders polysilicon layer 13 conductive. Layers 12 and 13 are patterned by lithography and anisotropic etching techniques as are conventional in the art to provide a desired pattern of gate electrodes such as gates 14a and 14b, as shown in FIG. 2.

Lightly doped drain (LDD) N− regions 16 are ion implanted with a dose of approximately $5 \times 10^{13}$ atoms/cm$^2$. Sidewalls 15 are then formed adjacent to gates 14a, 14b. Source regions 17a, 17b and drain regions 18a, 18b are formed by ion implantation of N$^+$ ions with a dose of approximately $2 \times 10^{15}$ atoms/cm$^2$. A refractory metal layer 19 is subsequently formed over source regions 17a, 17b and drain regions 18a, 18b. Refractory metal layer 19, may be composed of TiSi$_2$ or CoSi$_2$ is deposited by sputtering the metal followed by silicidation using rapid thermal annealing. A preferred thickness of refractory metal layer 19 is between 400 Å to 1000 Å. Unreacted material is removed from the oxide substrate by an ammonium peroxide solution. The purpose of refractory metal layer 19 is to lower the resistance in source regions 17a, 17b and drain regions 18a, 18b.

Figure 3:
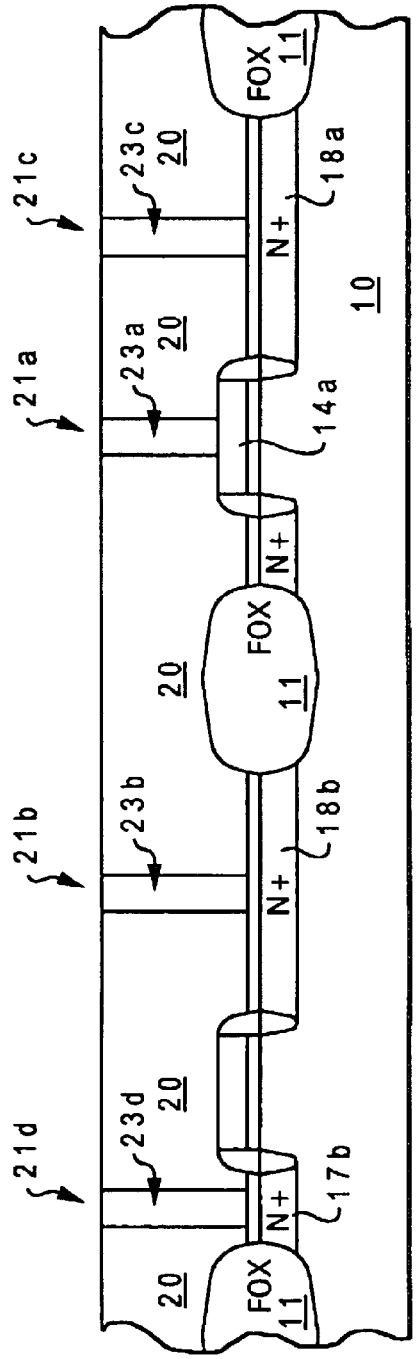
FIG. 3 illustrates the formation of contacts on the substrate from FIG. 2, in accordance with a preferred embodiment of the present invention.

A passivation (or insulating) layer 20 is subsequently formed over transistors T1 and T2, as shown in FIG. 3. Passivation layer 20 may be composed of borophosphosilicate glass (BPSG) or phosphosilicate glass (PSG), with an operational thickness of approximately 3000 Å to 8000 Å. Passivation layer 20 can be deposited by a chemical vapor deposition (CVD) process, and then be planarized by a chemical mechanical polishing (CMP) process.

Next, contact windows are formed through passivation layer 20. For example, a contact window 21a is formed through passivation layer 20 at gate 14a, and a contact window 21b is formed through passivation layer 20 at drain region 18b, as shown in FIG. 3. In addition, a contact window 21c is formed through passivation layer 20 at drain region 18a, and a contact window 21d is formed through passivation layer 20 at source region 17b. Conventional lithography and etching techniques can be used to form contact windows 21a–21d. Passivation layer 20 is anisotropically etched back using a gas mixture of CHF$_3$ and O$_2$ to form sidewalls within contact windows 21a–21d.

Following the etching of passivation layer 20, a liner metal such as titanium and a layer of titanium nitride are formed within contact windows 21a–21d. Titanium reduces metal oxides present within contact windows 21a–21d, and titanium nitride layer serves as a diffusion barrier to prevent titanium from diffusing into passivation layer 20.

Tungsten bottom contacts (or studs) 23a–23d are then formed within contact windows 21a–21d, respectively. Tungsten bottom contacts 23a–23d can be formed by depositing and planarizing tungsten. Other metals that can be used as bottom contacts are aluminum or copper.

Figure 4:
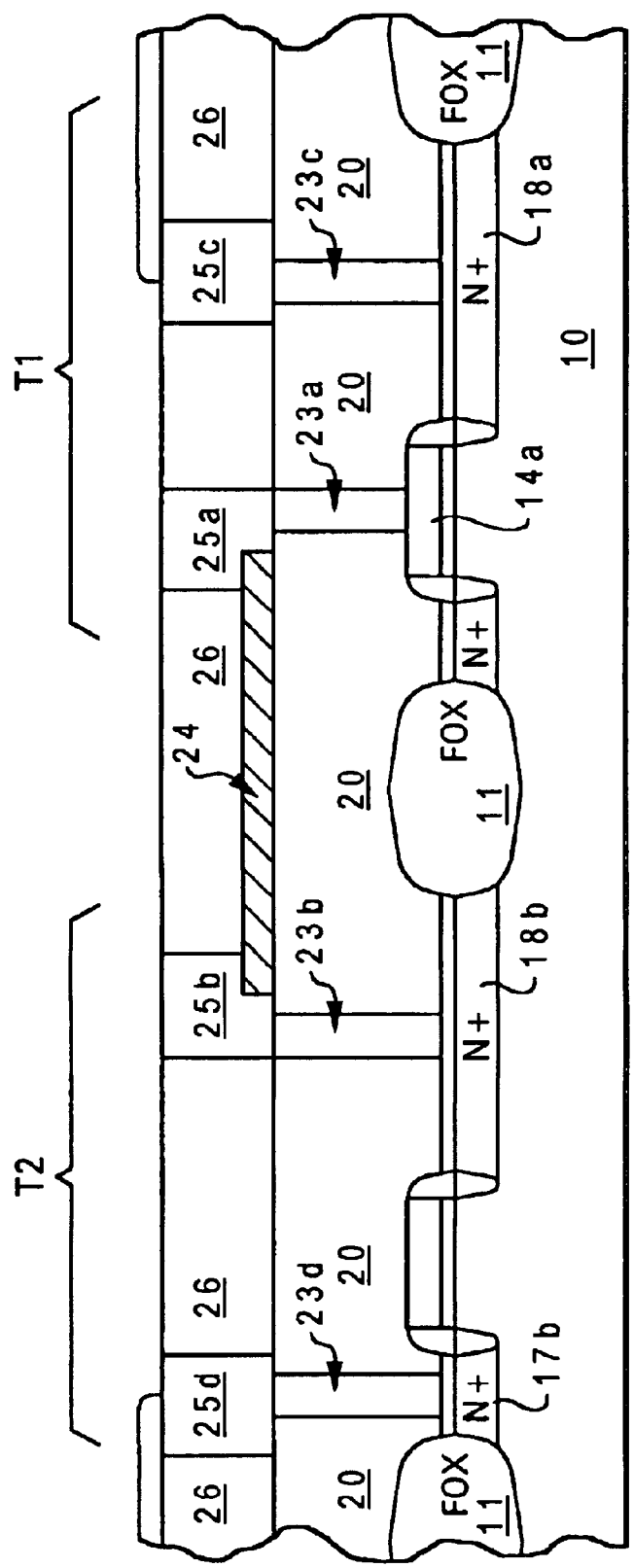
FIG. 4 illustrates the formation of a polysilicon resistor on the substrate from FIG. 2, in accordance with a preferred embodiment of the present invention.

A second polysilicon (resistor) layer 24 is subsequently deposited over passivation layer 20, as shown in FIG. 4, following the formation of tungsten bottom contacts 23a–23d. Polysilicon layer 24 is approximately 200 Å–2000 Å and may be deposited as amorphous silicon at approximately 400° C. by Plasma Enhanced Chemical Vapor Deposition (PECVD), to be crystallized into polysilicon at the next high temperature step. Polysilicon layer 24 is then ion implanted with phosphorous or arsenic ions with a concentration of approximately $10^{20}$ atoms/cm$^3$ and an energy of approximately between 80 KeV and 150 KeV. As a resistive element, polysilicon layer 24 preferably has a sheet resistance in the order of $10^4$–$10^5$ Ω/square.

A second oxide layer 26 is then deposited over the top of on passivation layer 20 and polysilicon layer 24 using LPCVD. Second oxide layer 26, preferably made of silicon dioxide, protects polysilicon layer 24 from subsequent processing steps.

Top contacts (or second contacts) 25a–25d are then formed through second oxide layer 26. For example, top contact 25a is formed through second oxide layer 26 to connect polysilicon layer 24 to tungsten bottom contact 23a, and top contact 25b is formed through second oxide layer 26 to connect polysilicon layer 24 to tungsten bottom contact 23b, as shown in FIG. 4. Conventional lithography and etching techniques can be used to form top contacts 25a–25d. For example, second oxide layer 26 can be anisotropically etched back using a gas mixture of CHF$_3$ and O$_2$ to form contact windows for top contacts 25a–25d. A liner metal such as titanium and a layer of titanium nitride are formed in the contact window. Top contacts 25a–25d can then be formed by depositing and planarizing tungsten.

As shown in FIG. 4, polysilicon layer 24 is connected to tungsten bottom contacts 23a, 23b via top contacts 25a, 25b, respectively. Accordingly, polysilicon layer 24 connects gate 14a of transistor T1 to drain region 18b of transistor T2.

Figure 5:
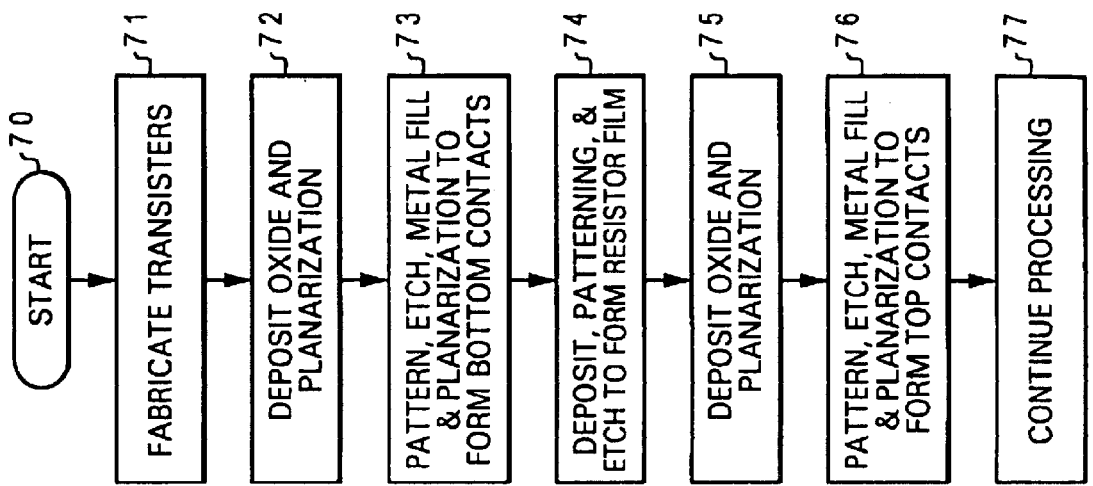
FIG. 5 is a process flow diagram of a method for fabricating a polysilicon resistor within a semiconductor device, in accordance with a preferred embodiment of the present invention.

Referring now to FIG. 5, there is illustrated a high-level process flow diagram for fabricating a compact polysilicon resistor within a semiconductor IC device, in accordance with a preferred embodiment of the present invention. Starting at block 70, transistors are first fabricated by commonly known methods, as shown in block 71. Then, a layer of oxide (first passivation layer) is deposited and planarized, as depicted in block 72. Bottom contacts are then form by depositing and planarizing tungsten after patterning and etching the oxide layer, as illustrated in block 73. A resistor film is formed by depositing a polysilicon layer on the substrate after patterning and etching, as shown in block 74. Another layer of oxide (second passivation layer) is deposited and planarized, as depicted in block 75. Top contacts are then form by depositing and planarizing tungsten after patterning and etching the second oxide layer, as illustrated in block 76. Finally, the semiconductor substrate is subjected to further processing, as shown in block 77, to complete the fabrication of a semiconductor IC device. Those processing steps, which are known to those skilled in the relevant art, are beyond the scope of the present disclosure.

As has been described, the present invention provides an improved method for fabricating a compact polysilicon resistor within a semiconductor IC device. With the present invention, a polysilicon resistor is formed on a planar surface level with the top of tungsten contacts connecting to underlying devices. Having a polysilicon resistor formed on a separate level than that used to form the gate electrode allows the thickness of the polysilicon resistor to be tailored to better suit the desired properties of the polysilicon resistor. To improve the resistive temperature coefficient of the polysilicon, a very thin polysilicon resistor has been used because this allows for a relative increase in the doping concentration. This increase in concentration gives rise to less change in resistance over the IC devices operating temperature range, allowing for faster devices (limited by highest value of resistance across temperature). Although polysilicon is used to form a resistor in the present disclosure, any resistive material may be substituted for polysilicon. Furthermore, although the resistor of the present invention is shown to be utilized in a SEU immuned SRAM cell, the resistor of the present invention is also applicable to other types of semiconductor devices such as microprocessors, microcontrollers, etc.

While the invention has been particularly shown and described with reference to a preferred embodiment, it will be understood by those skilled in the art that various changes in form and detail may be made therein without departing from the spirit and scope of the invention.

What is claimed is:

1. A resistor, comprising:
   a first passivation layer overlying a semiconductor substrate having a plurality of transistors;
   a first bottom contact and a second bottom contact formed through said first passivation layer at a first contact location and a second contact location, respectively;
   a resistive film formed over said first passivation layer to serve as a resistor, wherein said resistive film has a first end and a second end;
   a first top contact connecting said first bottom contact to said first end of said resistive film; and
   a second top contact connecting said second bottom contact to said second end of said resistive film.

2. The resistor according to claim 1, wherein said resistive film is a polysilicon layer.

3. The resistor according to claim 2, wherein said polysilicon layer has a thickness of approximately 200 Å–2000 Å.

4. The resistor according to claim 2, wherein said polysilicon layer is implanted with a dopant impurity to achieve a sheet resistance in the order of $10^4$–$10^5$ Ω/square.

5. The resistor according to claim 1, wherein first passivation layer has a thickness of approximately 3000 Å to 8000 Å.

6. The resistor according to claim 1, wherein said resistor further includes a second passivation layer overlying resistive film.

7. A semiconductor device, comprising:
   a semiconductor substrate;
   a plurality of transistors formed on said semiconductor substrate; and
   a resistor coupled to some of said plurality transistors, wherein said resistor includes:
      a first passivation layer overlying said semiconductor substrate having said plurality of transistors;
      a first bottom contact and a second bottom contact formed through said first passivation layer at a first contact location and a second contact location, respectively;
      a resistive film formed over said first passivation layer to serve as a resistor, wherein said resistive film has a first end and a second end;
      a first top contact connecting said first bottom contact to said first end of said resistive film; and
      a second top contact connecting said second bottom contact to said second end of said resistive film.

8. The semiconductor device according to claim 7, wherein said resistive film is a polysilicon layer.

9. The semiconductor device according to claim 8, wherein said polysilicon layer has a thickness of approximately 200 Å–2000 Å.

10. The semiconductor device according to claim 8, wherein said polysilicon layer is implanted with a dopant impurity to achieve a sheet resistance in the order of $10^4$–$10^5$ Ω/square.

11. The semiconductor device according to claim 7, wherein first passivation layer has a thickness of approximately 3000 Å to 8000 Å.

12. The semiconductor device according to claim 7, wherein said semiconductor device is a single-event upset immuned static random access memory device.

13. The semiconductor device according to claim 7, wherein said semiconductor device is a processor device.

14. The semiconductor device according to claim 7, wherein said resistor further includes a second passivation layer overlying resistive film.

* * * * *